(12) United States Patent
Thurgate et al.

(10) Patent No.: US 8,642,441 B1
(45) Date of Patent: Feb. 4, 2014

(54) SELF-ALIGNED STI WITH SINGLE POLY FOR MANUFACTURING A FLASH MEMORY DEVICE

(75) Inventors: Tim Thurgate, Sunnyvale, CA (US);
Shenqing Fang, Fremont, CA (US);
Kuo-Tung Chang, Saratoga, CA (US);
YouSeok Suh, Cupertino, CA (US);
Meng Ding, Sunnyvale, CA (US);
Hidehiko Shiraiwa, San Jose, CA (US);
Amol Joshi, Sunnyvale, CA (US);
Harpreet Sachar, Milpitas, CA (US);
David Matsumoto, San Jose, CA (US);
Lovejeet Singh, Sunnyvale, CA (US);
Chih-Yuh Yang, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 351 days.

(21) Appl. No.: 11/639,667

(22) Filed: Dec. 15, 2006

(51) Int. Cl.
*H01L 21/76* (2006.01)

(52) U.S. Cl.
USPC ........... 438/400; 438/230; 438/264; 438/424; 438/593; 438/787; 257/506

(58) Field of Classification Search
USPC .................................................. 438/270, 435
See application file for complete search history.

(56) References Cited

U.S. PATENT DOCUMENTS

| | | | |
|---|---|---|---|
| 4,935,378 A * | 6/1990 | Mori | 438/453 |
| 4,980,309 A * | 12/1990 | Mitchell et al. | 438/263 |
| 5,173,436 A * | 12/1992 | Gill et al. | 438/262 |
| 5,523,249 A * | 6/1996 | Gill et al. | 438/263 |
| 5,966,603 A * | 10/1999 | Eitan | 438/258 |
| 6,001,704 A * | 12/1999 | Cheng et al. | 438/410 |
| 6,127,215 A * | 10/2000 | Joachim et al. | 438/224 |
| 6,146,975 A * | 11/2000 | Kuehne et al. | 438/437 |
| 6,153,494 A * | 11/2000 | Hsieh et al. | 438/424 |
| 6,159,801 A * | 12/2000 | Hsieh et al. | 438/259 |
| 6,166,409 A * | 12/2000 | Ratnam et al. | 257/316 |
| 6,184,085 B1 * | 2/2001 | Jeong | 438/258 |
| 6,204,530 B1 * | 3/2001 | Choi | 257/315 |
| 6,207,490 B1 * | 3/2001 | Lee | 438/241 |
| 6,222,225 B1 * | 4/2001 | Nakamura et al. | 257/315 |
| 6,258,669 B1 * | 7/2001 | Park | 438/264 |
| 6,281,050 B1 * | 8/2001 | Sakagami | 438/142 |
| 6,355,514 B1 * | 3/2002 | Pham | 438/211 |
| 6,395,592 B1 * | 5/2002 | Wu | 438/201 |
| 6,403,421 B1 * | 6/2002 | Ikeda et al. | 438/267 |
| 6,417,047 B1 * | 7/2002 | Isobe | 438/258 |
| 6,448,606 B1 * | 9/2002 | Yu et al. | 257/315 |
| 6,486,508 B1 * | 11/2002 | Lee | 257/316 |
| 6,555,427 B1 * | 4/2003 | Shimizu et al. | 438/238 |
| 6,649,472 B1 * | 11/2003 | Hsieh | 438/257 |
| 6,677,224 B2 * | 1/2004 | Tseng | 438/593 |
| 6,682,978 B1 * | 1/2004 | Park et al. | 438/259 |
| 6,709,924 B1 * | 3/2004 | Yu et al. | 438/257 |
| 6,720,610 B2 * | 4/2004 | Iguchi et al. | 257/315 |

(Continued)

*Primary Examiner* — N Drew Richards
*Assistant Examiner* — Ankush Singal

(57) ABSTRACT

A method for fabricating a memory device with a self-aligned trap layer and rounded active region corners is disclosed. In the present invention, an STI process is performed before any of the charge-trapping and top-level layers are formed. Immediately after the STI process, the sharp corners of the active regions are exposed. Because these sharp corners are exposed at this time, they are available to be rounded through any number of known rounding techniques. Rounding the corners improves the performance characteristics of the memory device. Subsequent to the rounding process, the charge-trapping structure and other layers can be formed by a self-aligned process.

12 Claims, 13 Drawing Sheets

(56) References Cited

U.S. PATENT DOCUMENTS

| | | | |
|---|---|---|---|
| 6,743,675 B2 * | 6/2004 | Ding | 438/257 |
| 6,768,161 B2 * | 7/2004 | Kinoshita | 257/316 |
| 6,781,189 B2 * | 8/2004 | Taylor | 257/317 |
| 6,825,128 B2 * | 11/2004 | Masuda | 438/750 |
| 6,891,246 B2 * | 5/2005 | Aritome | 257/510 |
| 6,894,339 B2 * | 5/2005 | Fan et al. | 257/314 |
| 6,900,100 B2 * | 5/2005 | Williams et al. | 438/259 |
| 6,903,408 B2 * | 6/2005 | Hsieh | 257/316 |
| 6,906,378 B2 * | 6/2005 | Sumino et al. | 257/315 |
| 7,005,714 B2 * | 2/2006 | Ozawa et al. | 257/390 |
| 7,009,245 B2 * | 3/2006 | Chang | 257/321 |
| 7,015,099 B2 * | 3/2006 | Kim et al. | 438/257 |
| 7,067,377 B1 * | 6/2006 | Park et al. | 438/270 |
| 7,087,950 B2 * | 8/2006 | Willer et al. | 257/314 |
| 7,091,091 B2 * | 8/2006 | Ding | 438/265 |
| 7,135,737 B2 * | 11/2006 | Jung | 257/320 |
| 7,151,295 B2 * | 12/2006 | Yaegashi et al. | 257/316 |
| 7,189,627 B2 * | 3/2007 | Wu et al. | 438/424 |
| 7,205,602 B2 * | 4/2007 | Hsieh | 257/315 |
| 7,297,595 B2 * | 11/2007 | Jung et al. | 438/259 |
| 7,358,145 B2 * | 4/2008 | Yang | 438/391 |
| 7,399,674 B2 * | 7/2008 | Chen et al. | 438/264 |
| 7,494,869 B2 * | 2/2009 | Sato | 438/257 |
| 7,560,775 B2 * | 7/2009 | Takamura et al. | 257/345 |
| 7,719,050 B1 * | 5/2010 | Wang | 257/316 |
| 7,985,651 B2 * | 7/2011 | Lee et al. | 438/270 |
| 8,008,153 B2 * | 8/2011 | Lee et al. | 438/263 |
| 8,173,515 B2 * | 5/2012 | Nakamori et al. | 438/435 |
| 2002/0132427 A1 * | 9/2002 | Rudeck et al. | 438/257 |
| 2002/0153557 A1 * | 10/2002 | Hurst et al. | 257/329 |
| 2002/0179962 A1 * | 12/2002 | Kinoshita | 257/315 |
| 2003/0013255 A1 * | 1/2003 | Lojek et al. | 438/266 |
| 2003/0080372 A1 * | 5/2003 | Mikolajick | 257/315 |
| 2003/0111687 A1 * | 6/2003 | Willer et al. | 257/329 |
| 2003/0119314 A1 * | 6/2003 | Ogura et al. | 438/683 |
| 2003/0181020 A1 * | 9/2003 | Ishitsuka et al. | 438/424 |
| 2003/0208663 A1 * | 11/2003 | Van Buskirk et al. | 711/156 |
| 2003/0209760 A1 * | 11/2003 | Maruyama | 257/347 |
| 2004/0048433 A1 * | 3/2004 | Takahashi | 438/238 |
| 2004/0082141 A1 * | 4/2004 | Mizukoshi | 438/424 |
| 2004/0097080 A1 * | 5/2004 | Kim et al. | 438/689 |
| 2004/0145007 A1 * | 7/2004 | Sumino et al. | 257/315 |
| 2004/0253831 A1 * | 12/2004 | Sun et al. | 438/757 |
| 2005/0142765 A1 * | 6/2005 | Joo | 438/264 |
| 2005/0186739 A1 * | 8/2005 | Wang et al. | 438/267 |
| 2005/0189582 A1 * | 9/2005 | Mikolajick | 257/324 |
| 2005/0196935 A1 * | 9/2005 | Ishitsuka et al. | 438/437 |
| 2005/0287763 A1 * | 12/2005 | Kim et al. | 438/424 |
| 2006/0099755 A1 * | 5/2006 | Mori | 438/201 |
| 2006/0163202 A1 * | 7/2006 | Shimizu et al. | 216/67 |
| 2006/0270156 A1 * | 11/2006 | Kim et al. | 438/257 |
| 2006/0289924 A1 * | 12/2006 | Wang | 257/315 |
| 2006/0291281 A1 * | 12/2006 | Wang et al. | 365/185.05 |
| 2007/0023792 A1 * | 2/2007 | Takamura et al. | 257/288 |
| 2007/0023815 A1 * | 2/2007 | Oh et al. | 257/314 |
| 2007/0026632 A1 * | 2/2007 | Yamamoto | 438/424 |
| 2007/0087523 A1 * | 4/2007 | Yeh et al. | 438/426 |
| 2007/0099369 A1 * | 5/2007 | Ning | 438/199 |
| 2008/0084765 A1 * | 4/2008 | Chang | 365/185.33 |
| 2008/0128774 A1 * | 6/2008 | Irani et al. | 257/314 |
| 2008/0171416 A1 * | 7/2008 | Fang et al. | 438/257 |
| 2008/0224200 A1 * | 9/2008 | Chen et al. | 257/316 |
| 2010/0244247 A1 * | 9/2010 | Chang et al. | 257/741 |

* cited by examiner

SELF-ALIGNED STI WITH SINGLE POLY FOR MANUFACTURING A FLASH MEMORY DEVICE

FIELD OF THE INVENTION

The present invention relates, in general, to semiconductor memory devices.

BACKGROUND OF THE INVENTION

Data is digitally stored in semiconductor memory devices. These semiconductor memory devices fall into one of two categories. Volatile memory devices retain their data only when they are powered on; whereas, non-volatile memory chips can retain the data even if no external power is being supplied to the memory device. One popular form of non-volatile memory device is flash memory. Flash memory is versatile because it can be erased and programmed multiple times. Furthermore, flash memory is relatively inexpensive compared to other types of non-volatile memory devices. Consequently, flash memory is ideal for applications that demand significant amounts of non-volatile, solid-state storage. Examples of applications employing flash memory include USB flash drives, digital audio players, digital cameras and camcorders, mobile phones, automotive control systems, gaming consoles, etc.

Flash memory is typically made up of an array of floating gate transistors, commonly referred to as memory "cells." One or more bits of data are stored as charge by each memory cell. For example, dual bit memory devices use a silicon-oxide-nitride-oxide-silicon (SONOS) type architecture in which a lower layer of silicon oxide is formed over a semiconductor substrate that is typically silicon. A layer of silicon nitride is formed on the lower layer of silicon oxide, an upper layer of silicon oxide is formed on the layer of silicon nitride and a layer of an electrically conductive material is formed on the upper layer of silicon oxide. The combination of the lower silicon oxide layer, the silicon nitride layer, and the upper silicon oxide layer are capable of trapping charge and are commonly referred to as a charge trapping dielectric structure or layer. It should be noted that the charge trapping structure is defined as a stack of ONO. When more than one bit of information is stored in the charge trapping structure, the memory device is referred to as a dual bit memory device. Bit lines are typically formed in the portion of the semiconductor substrate that is below the charge trapping structure and word lines may be formed from the layer of electrically conductive material that is disposed on the charge trapping structure. In a dual bit memory device, two bits are stored per cell by biasing the bit line, the word line, the source, and the drain of the memory cell such that a bit and a complementary bit are stored. This arrangement enables flash memory cells to be manufactured efficiently and economically.

FIG. 1 shows a conventional memory cell. In a conventional flash memory fabrication process, the tunnel oxide, the charge-trapping layer, and top charge block oxide 101 (e.g., oxide-nitride-oxide ONO layer) and one or more polysilicon layers 102 are formed before the shallow trench isolation (STI 103) definition. It should be noted that the nitride layer can be comprised of nitride, silicon rich nitride, a combination of nitride on top of silicon rich nitride or multiple layers with different percentages of silicon content. After the STI 103 formation, another polysilicon layer can be deposited on the previous polysilicon layer. Subsequently, the word line is defined. Unfortunately, this conventional approach produces sharp corners 104-105 because the nature of the STI process produces near vertical sides. These sharp corners directly contribute to device degradation in performance and reliability. Simply going back and rounding off the sharp corners cannot solve these associated problems due to the increase in oxide encroachment which detrimentally impacts the erase and programming of the memory cell. Furthermore, rounding off the sharp corners would reduce the core cell current by a smaller effective channel width, which is highly undesirable.

Furthermore, various semiconductor fabrication processes use masks to help align the memory cells. Aligning the cells produces a more organized and compact design. Although masking techniques properly align the cells, scaling becomes an issue. It becomes harder to place the cells closer together. It is important to place the cells as close together without impacting their functionality because denser cells can hold more data for a given semiconductor area. In other words, tighter tolerances allow for greater memory capacity at reduced cost.

SUMMARY OF THE INVENTION

A method for fabricating a memory device with a self-aligned charge trapping layer and an active region with rounded corners is disclosed. An STI process is performed before any of the charge-trapping and top-level layers are formed. Immediately after the STI process, the sharp corners of the active regions are exposed. Because these sharp corners are exposed at this time, they are available to be rounded through any number of known rounding techniques. Rounding the corners improves the performance characteristics of the memory device. Subsequent to the rounding process, the charge-trapping structure and other layers are formed through a self-aligned process. In one embodiment, a sacrificial top oxide, polish, recess, nitride etch, sacrificial top oxide etch, and top oxide process flow makes the charge trapping layer self-aligned.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the invention are semi-diagrammatic and not drawn to scale, and particularly, some of the dimensions are for the clarity of presentation and are shown exaggerated in the Figures.

Figure 1:
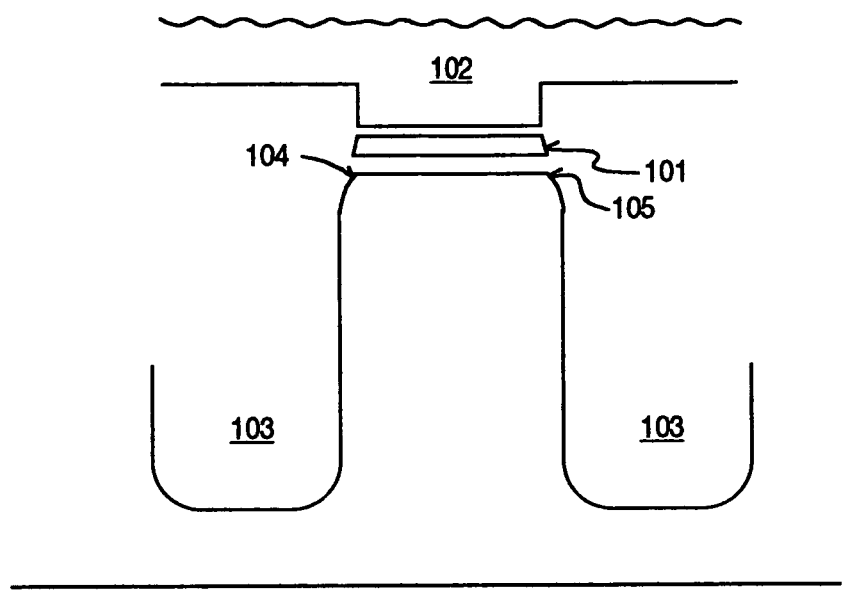
FIG. 1 shows a conventional memory cell.
Figure 2:
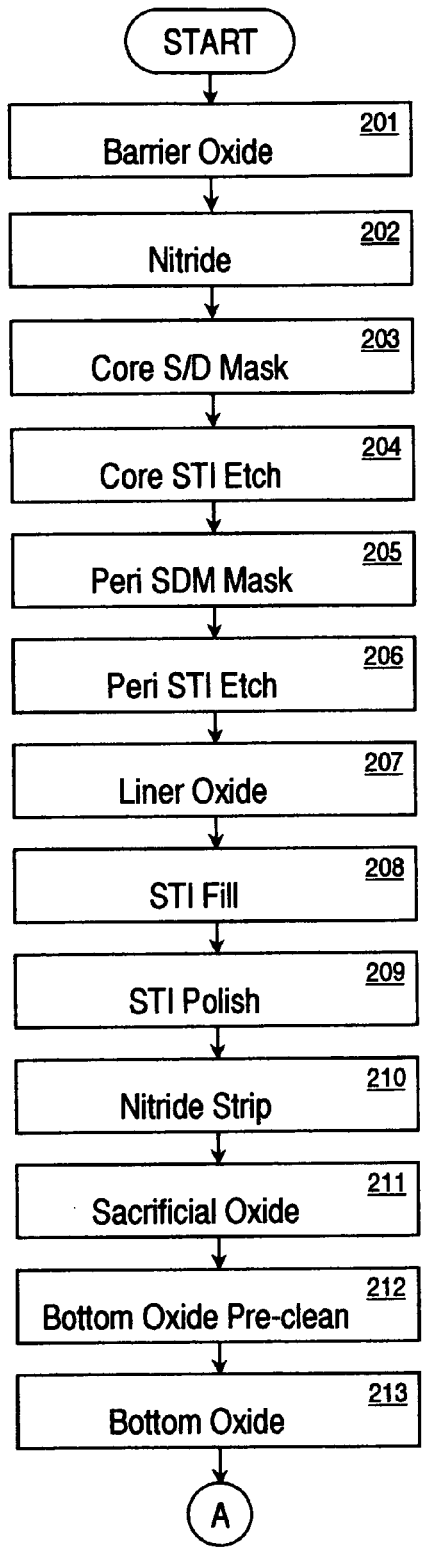
FIG. 2 shows the process flow for fabricating the memory device according to one embodiment of the present invention.
Figure 3:
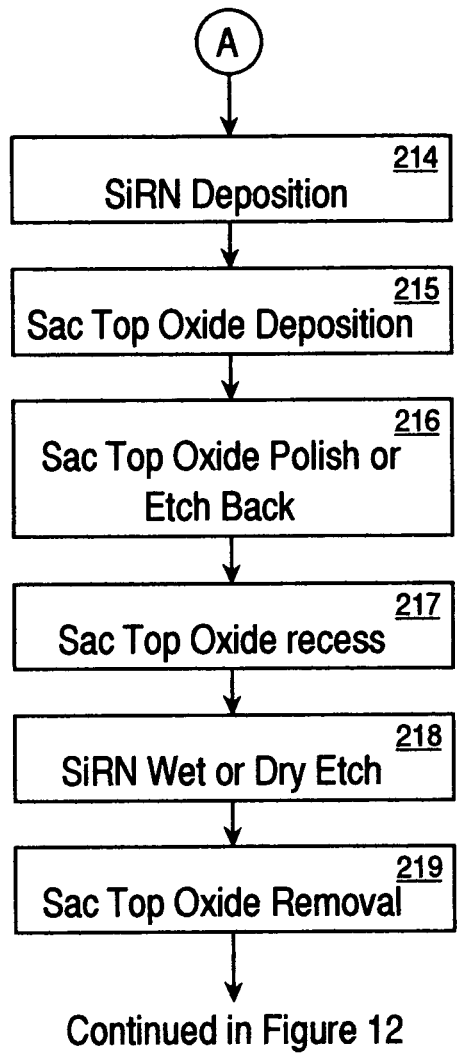
FIG. 3 shows the continued process flow for fabricating the memory device according to one embodiment of the present invention.
Figure 4:
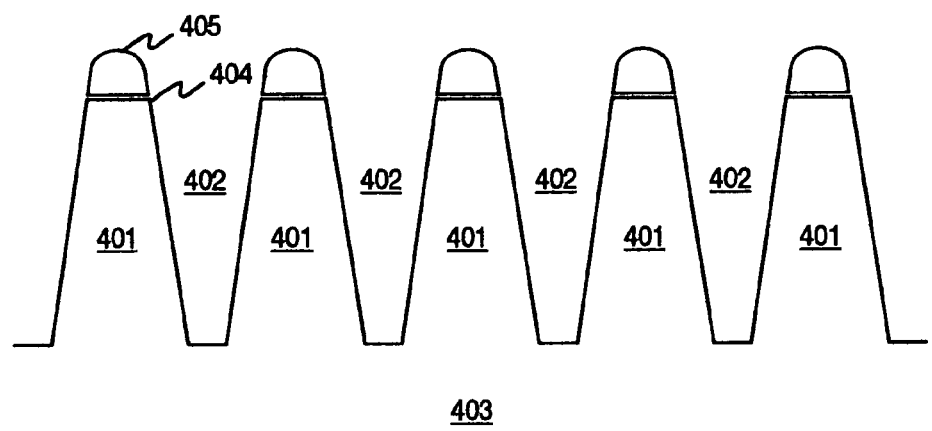
FIG. 4 shows the patterning after the STI process is performed.

Generally, the present invention provides a method for manufacturing a self-aligned memory device with generally rounded polysilicon and STI corners. Semiconductor non-volatile memory devices, such as NOR-type and NAND-type flash memories, can be constructed using oxide/nitride/oxide (ONO) configurations. The nitride layer (e.g., silicon nitride, silicon rich nitride, or multiple layers with different percentages of Si content) closest to the semiconductor substrate in an ONO configuration acts as the charge storing layer and is typically programmed and erased by the tunneling of electrons into and out of this layer. FIGS. 2 and 3 show the process flows for fabricating the memory device according to one embodiment of the present invention. Initially, a barrier oxide layer is formed on a silicon substrate, step 201. The barrier oxide can be grown or deposited over the substrate. A nitride layer is then formed in step 202. In step 203, a core source/drain mask is patterned. The core STI etch then follows, step 204. FIG. 4 shows the STI profile after the STI etch is performed. The STI process defines a number of active regions 401 separated by trenches 402 over a common substrate 403. The oxide 404 and nitride 403 from steps 201 and 202 reside on active regions 401. Active regions 401 are regions where the transistor action occurs. Substrate 403 can be fabricated from silicon, silicon based composites, or other known semiconductor materials including, but not limited to polysilicon, germanium, silicon germanium, Semiconductor-On-Insulator (SOI) material, etc. It should be noted that the conductivity type of substrate 403 is not a limitation of the present invention. In accordance with one embodiment, the conductivity type is chosen to form an N-channel insulated gate field effect transistor. However, the conductivity type can be selected to form a P-channel insulated gate semiconductor device or a complementary insulated gate semiconductor device (e.g., CMOS).

Figure 5:
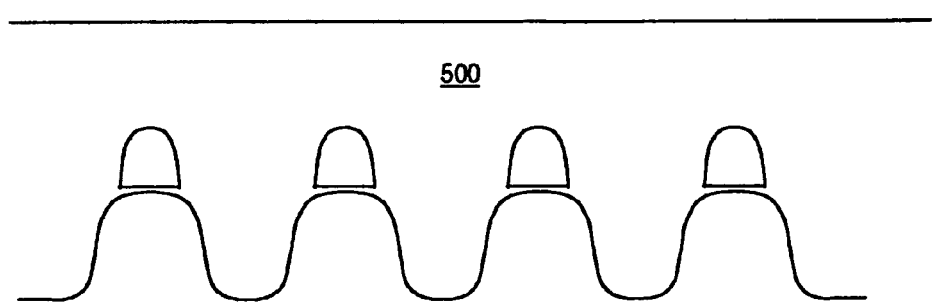
FIG. 5 shows a cross-sectional side view of one embodiment of the memory device after STI fill.
Figure 6:
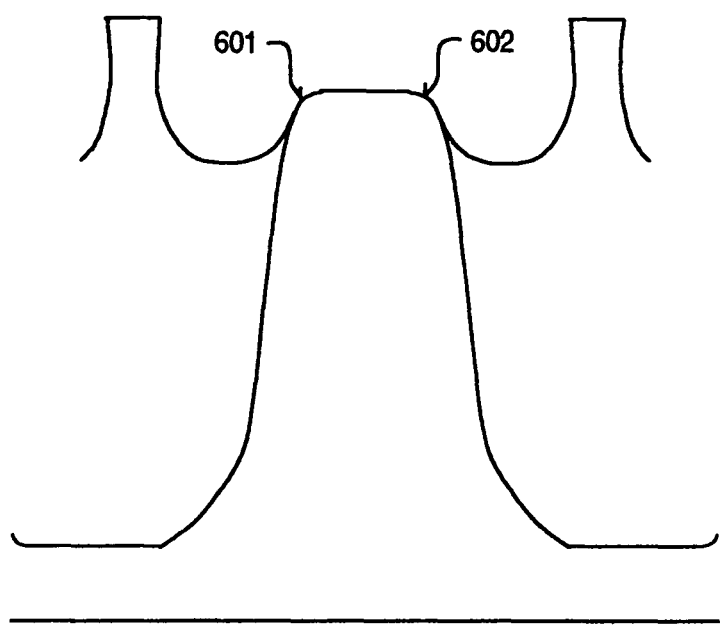
FIG. 6 shows a cross-sectional view of one embodiment of the memory device after the nitride strip, sacrificial oxide and bottom oxide pre-cleaning.

Next, a peripheral source/drain masking (SDM) step 205 is performed. The peripheral STI etching step 206 follows. The peripheral SDM and STI etch can be combined with core SDM and STI etch, respectively. In step 207, one or more liner oxide layers are formed with or without wet etch of existing oxide before each liner oxide to round up the STI corners, and in step 208, an STI fill is performed. It is the combination of one or more liner oxide and/or cleaning processes which causes the corners of the STI to become rounded. It should be noted that other known processes for rounding the corners can be employed at this time. In the prior art, the STI trench was cut after substantially all the layers (including the charge-trapping layers) were formed. This resulted in a near-vertical planar cut which resulted in sharp STI corners. In contrast, one embodiment of the present invention performs the STI before the charge-trapping and other top layers are formed. This exposes the sharp corners of the STI active region so that some type of rounding process can be performed to round out those now-exposed sharp corners. FIG. 5 shows a cross-sectional side view of one embodiment of the memory device after STI fill step 208. The filling 500 can be an insulator material, such as an oxide formed by a high density plasma process. This trench fill material 500 is polished back in step 209. The nitride is stripped in step 210. One or more sacrificial oxide layers with or without wet etch of existing oxide before each sacrificial oxide are performed in step 211. The sacrificial oxide can also be skipped. The sacrificial oxide or the barrier oxide in case that sacrificial oxide is skipped, is then removed by a bottom oxide pre-clean step 217. The oxide removal can be done in a variety of ways. It can be accomplished, for example, by means of wet or dry etch, sputtering, plasma techniques, or by other means. FIG. 6 shows a cross-sectional view of one embodiment of the memory device after the nitride strip, sacrificial oxide and bottom oxide pre-cleaning. It should be noted that the corners 601 and 602 are now rounded.

Figure 7:
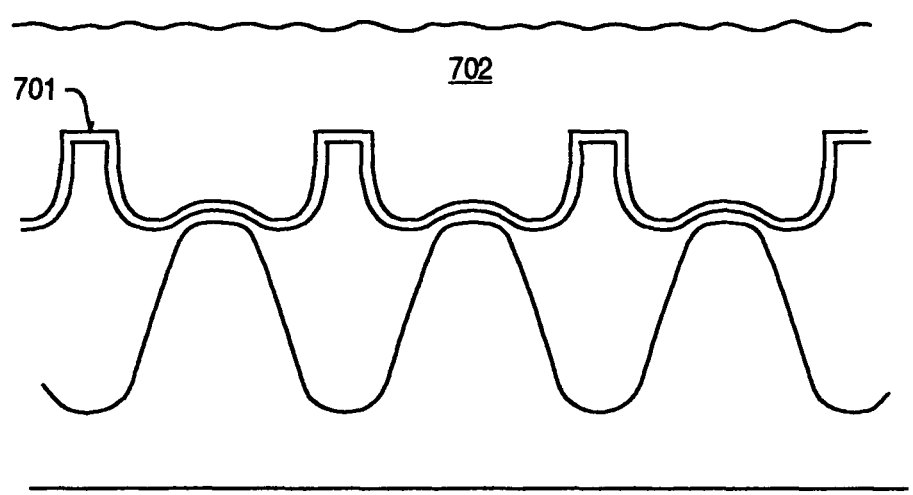
FIG. 7 shows a cross-sectional view of the memory device as it exists after the sacrificial top oxide deposition.

At this point, a charge trapping structure is fabricated. In one embodiment, this entails growing a bottom oxide layer, as indicated by step 213. A silicon-rich nitride (SiRN) or multiple layers of nitride with different percentages of Si content are deposited on top of the bottom oxide layer in step 214. A sacrificial top oxide process is then performed over the SiRN layer in step 215. FIG. 7 shows a cross-sectional view of the memory device as it exists after the sacrificial top oxide deposition/process of step 215. The silicon-rich nitride (SiRN) is depicted as layer 701. The sacrificial top oxide is 702. Note that the sacrificial top oxide will be completely etched off in step 219. The top oxide will be formed in step 1204 or 1215 described below in reference to FIG. 12. It should be noted that any charge trapping structure, including but not limited to ONO, can be utilized within the scope of the present invention. Other charge trapping structures can include three or more dielectric layers disposed on the active regions. For example, the top and bottom dielectric layers may be silicon dioxide layers that are oxygen-rich silicon dioxide layers; one or both of which may be thermally grown or deposited oxide layers. Alternatively, one or both of the bottom and top dielectric layers may be silicon dioxide layers that are nitrided oxide layers. The middle dielectric layer may be a silicon-rich silicon nitride layer or a combination of multiple layers with different percentages of Si content.

It should be understood that the charge trapping structure is not limited to being a three layer structure or a structure limited to silicon dioxide and silicon nitride. The charge trapping structure may be any dielectric layer or layers capable of trapping charge or that facilitate charge trapping. Other suitable materials include an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric, an oxide/strontium titanate/oxide trilayer dielectric ($SiO_2/SrTiO_3/$ BaSrTiO$_2$), and oxide/hafnium oxide/oxide trilayer dielectric, and the like. A tunnel oxide may be formed between the semiconductor substrate and charge trapping structure. Although any charge trapping structure can be used, it is of significance that the charge trapping structure and any polysilicon deposition occurs after the STI is formed and the STI corners are rounded.

Figure 8:
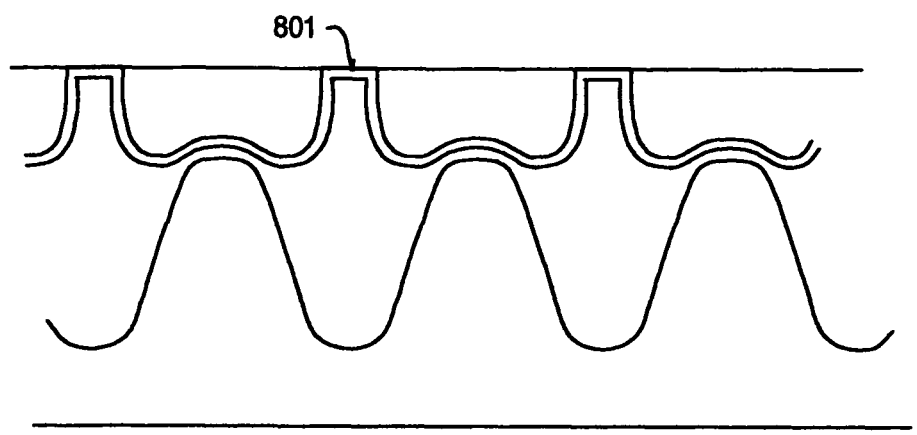
FIG. 8 shows a cross-sectional view of an embodiment of the memory device using a CMP or etch back technique whereby the top oxide layers are polished back or etched back to the boundary of the SiRN layer.
Figure 9:
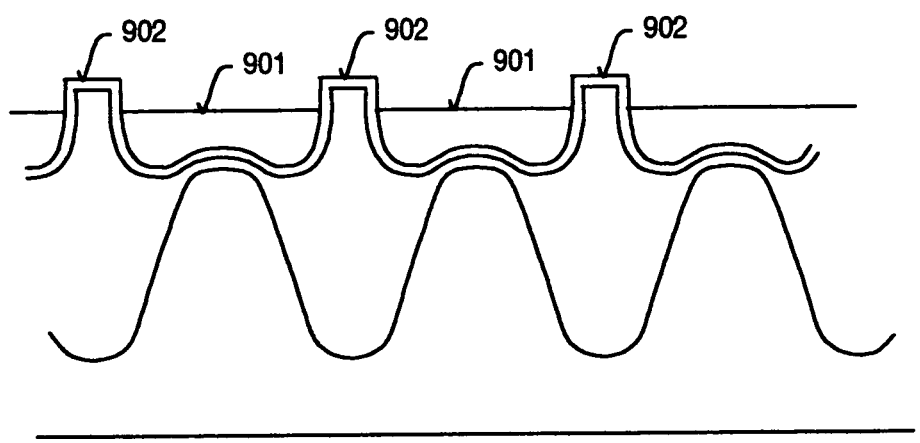
FIG. 9 shows the cross-sectional view of an embodiment of the memory device after sacrificial top oxide recess.
Figure 10:
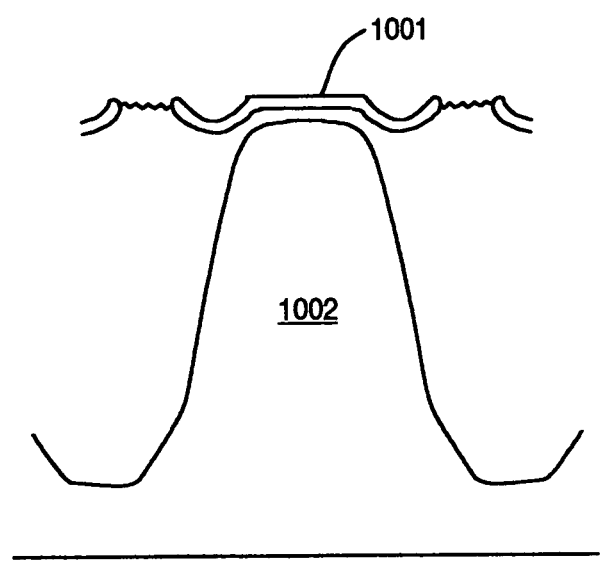
FIG. 10 shows the cross-sectional view of the memory device after performing the HDP recess and sacrificial top oxide removal.

In step 216, the sacrificial top oxide is polished back by CMP or etched back by plasma dry etch. For example, a chemical mechanical planarization (CMP) technique can be used to polish back the oxide layers to stop at the SiRN layer with or without partially removing SiRN. Other suitable planarization techniques include electropolishing, electrochemical polishing, chemical polishing, and chemically enhanced planarization. FIG. 8 shows a cross-sectional view of an embodiment of the memory device using a CMP technique whereby the sacrificial top oxide layers are polished back to the boundary 801 of the SiRN layer. In one embodiment, the SiRN layer is approximately 60 to 130 angstroms thick as deposit and final thickness can be approximately 30 to 100 angstroms thick. A sacrificial top oxide recess is performed in step 217. The recess can be performed by either a wet or dry etching process. FIG. 9 shows the cross-sectional view of an embodiment of the memory device after recess. As shown, the oxide 901 is now recessed below the tops 902 of the SiRN layer over the active regions. Next, the SiRN is wet or dry etched, step 218. This is done to separate the SiRN layers for each memory cell. In other words, the top portions of the SiRN layers are etched off so that each active region has its own separate SiRN layer. A sacrificial top oxide removal is performed in step 219. The cross-sectional view of the memory device after performing the sacrificial top oxide removal is shown in FIG. 10. It can be seen that the SiRN portion 1001 is segmented over the active region 1002. Furthermore, the combination of the sacrificial top oxide, polish and wet etch of the nitride makes the new integration scheme self-aligned according to this embodiment of the present invention. It should be noted that TEOS is one of the films that can be used for the sacrificial top oxide.

Figure 12:
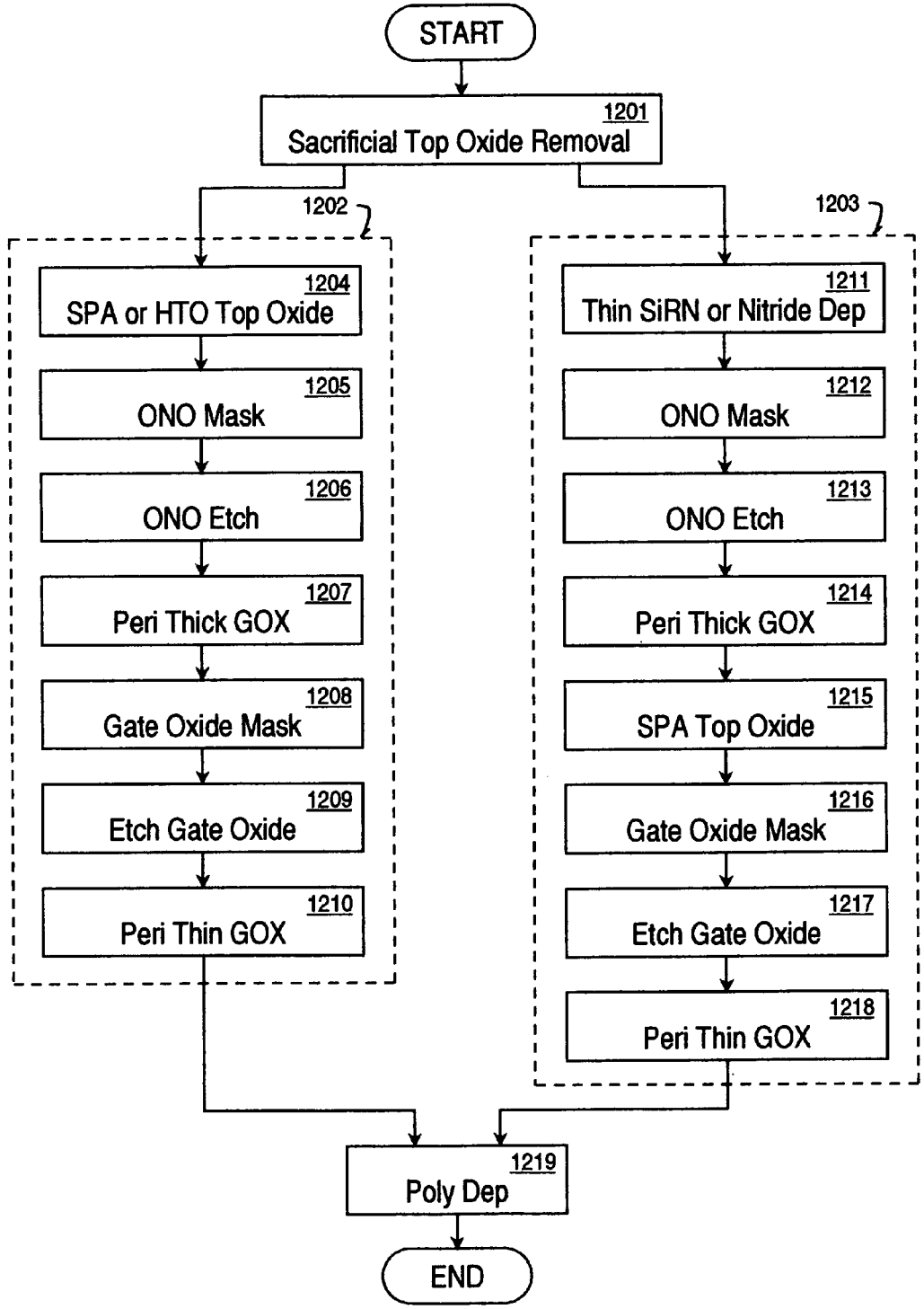
FIG. 12 is a flow diagram showing the process for two periphery integration schemes.

Usually a thick (200-400A) and a thin (20-100A) gate oxide are needed for periphery transistors of NAND or NOR flash memory. Two approaches for periphery transistor gate oxide are shown in FIG. 12 and described later below. After HTO or SPA top oxide, an ONO mask opens the periphery area. Dry or wet or a combination of dry and wet etch removes ONO layers in the periphery. A dry thick gate oxide is grown first. Gate oxide mask opens thin gate oxide area and a wet or dry etch removes the thick oxide and then a thin gate oxide is grown.

The other approach is for wet periphery thick oxide. Since during the wet oxidation oxygen diffuses through oxide in core STI area and encroaches core S/D, a thin (20-30A) SiRN or nitride is deposited first to block the steam oxide. An ONO mask opens the periphery area. Dry or wet or a combination of dry and wet etch removes ONO layers in the periphery. A thick steam gate oxide grows first and is followed by SPA top oxide. This SPA top oxide adds the thickness to the steam oxide and also consumes all the thin SiRN or nitride on core STI. Gate oxide mask opens thin gate oxide area and a wet or dry etch removes the thick oxide and then a thin gate oxide is grown.

Figure 11:
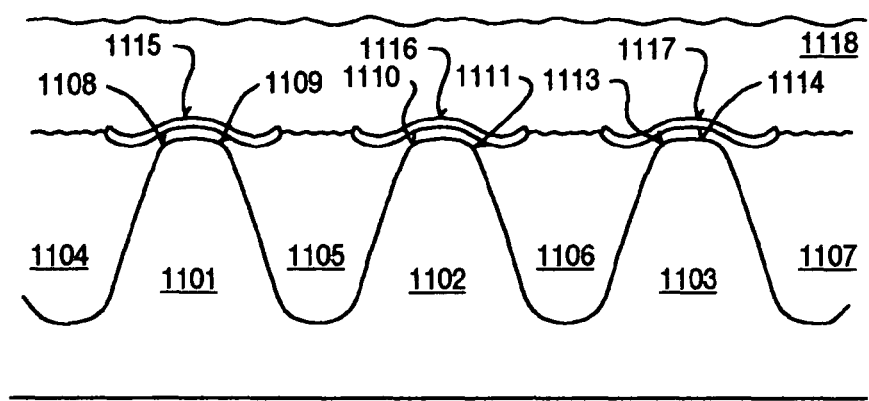
FIG. 11 shows the cross-sectional view of the self-aligned memory device with rounded corners according to one embodiment of the present invention.

FIG. 11 shows the cross-sectional view of the self-aligned memory device with rounded corners according to one embodiment of the present invention. Each active region 1101-1103 is separated on each side by trenches 1104-1107. The trenches are formed through an STI process as described above. Right after the STI process, the corners of these active regions 1101-1103 are sharp due to the way the trenches are vertically cut. Immediately upon forming the trenches 1104-1107, the corners are rounded. It is advantageous to round the corners at this time because they are exposed. The rounding process can be done in may different ways, such as by means of known cleaning/polishing and/or sacrificial oxide placement/removal. The corners 1108-1114 are rounded before any additional layers are formed. After the corners have sufficiently been rounded, any number or combination of layers can be deposited or grown over the active region. For example, a tunnel oxide layer (optional), ONO (ONO stands for tunnel oxide-nitride-top oxide) stacks 1115-1117, polysilicon layer(s) 1118, etc. can be formed after the rounding process.

It should be noted that steps 213-219 shown in the flow diagram of FIG. 2 is of particular relevance because these steps depict the process of forming self-aligned ONO stacks. In particular, the steps start with a bottom oxide. This is followed by depositing the SiRN. A sacrificial top oxide deposition is performed. The sacrificial top oxide is polished or etched back. A sacrificial oxide recess is performed, and a SiRN wet or dry etch is performed. This results in a self-aligned process which greatly improves scalability.

FIG. 12 is a flow diagram showing the process for two periphery integration schemes. Upon forming the self-aligned ONO stacks, a sacrificial oxide removal step 1201 is performed. Note that step 1202 is the same step as step 219 of FIG. 3. A first periphery integration scheme 1202 includes process steps 1204-1210. In process step 1204, an SPA or high temperature oxidation (HTO) is used to form a top oxide. An ONO masking is performed in step 1205. The ONO is etched in step 1206. A periphery thick gate oxide is fabricated in step 1207. Next, the gate oxide is masked in step 1208. The gate oxide is then etched in step 1209. And a periphery thin gate oxide is fabricated in step 1210.

A second periphery integration scheme 1203 includes process steps 1211-1218. In step 1211, a thin SiRN or Nitride layer is deposited. An ONO masking step 1212 is then performed. The ONO is then etched in step 1213. A periphery thick gate oxide layer is fabricated in step 1214. An SPA top oxide is fabricated in step 1215. The gate oxide is then masked in step 1216. The gate oxide is etched in step 1217. And a periphery thin gate oxide is fabricated in step 1218. After either of the two periphery integration schemes has been performed, a polysilicon layer is deposited in step 1219.

Figure 13:
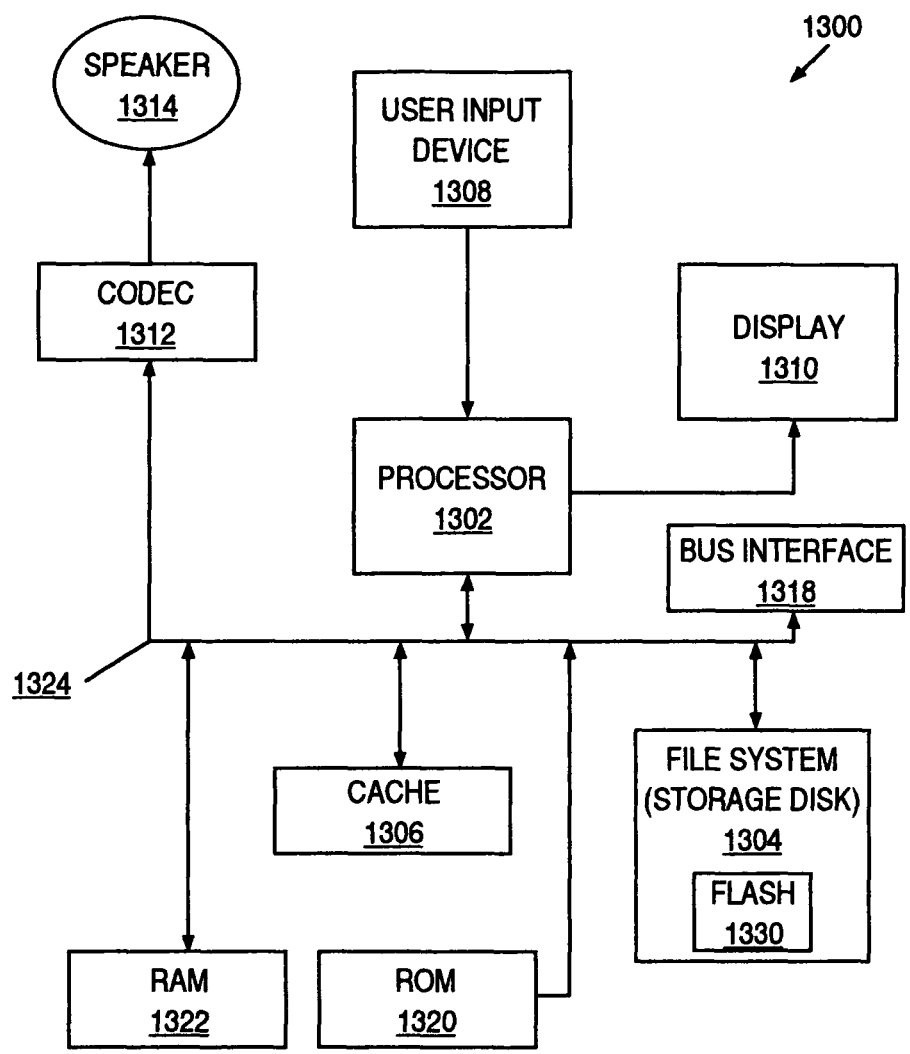
FIG. 13 shows a system according to embodiments of the present invention.

FIG. 13 shows a system according to embodiments of the present invention. The system 1300 can be a portable multimedia device, media player, communications device, networking devices, computing device, consumer electronic device, mobile computing device, image capture device, audio/visual device, gaming console, etc. System 1300 includes a process 1302 that pertains to a microprocessor or controller for controlling the overall processing of data in system 1300. Digital data is stored in a file system 1304 and a cache memory 1306. The file system 1304 typically provides high capacity storage capability for system 1300. File system 1304 can include a non-volatile flash memory 1330. Flash memory 1330 has rounded STI corners and is manufactured as described above. The system 1300 also includes volatile random access memory (RAM) 1320 and non-volatile read-only memory (ROM) 1322 for storing digital data. System 1300 also includes a user input device 1308, such as a button, keypad, dial, scroll wheel, touch sensitive pad, etc. A display 1310 is used to display visual information to the user. A data bus 1324 transfers data between the various components via a bus interface 1318. A compression-decompression (CODEC) chip can be used to facilitate data storage and transfers. A speaker 1314 is used to play back songs, voice messages, and other audio streams.

Therefore, a non-volatile, self-aligned semiconductor memory device having rounded STI corners and a method for manufacturing the device has been disclosed. In particular, the STI process is performed before the ONO and polysilicon deposition steps. This enables the STI corners to be rounded after the STI process but before the ONO and polysilicon deposition steps. This is in contrast to the conventional method of forming ONO and polysilicon before the STI definition. In the convention method, after the STI formation, another polysilicon is deposited on the previous polysilicon layer and then the word line is defined. This conventional method results in sharp polysilicon and STI corners which degrades device performance and reliability. By virtue of having rounded corners, the present invention mitigates the disadvantageous attributes corresponding to the sharp corners resulting from conventional fabrication techniques. Moreover, the present invention has greater scalability due to the fact that it is self-aligned. This is accomplished by means of a sacrificial top oxide, polish, and wet etch of the nitride. Although not shown, it should be appreciated that source and drain regions are formed in active regions of the substrate and that additional processing is performed to form a metallization system including contact structures.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A memory device, comprising:
   a semiconductor substrate;
   a plurality of active regions disposed over the semiconductor substrate, each active region of the plurality of active regions having a plurality of sharp corners;
   a plurality of trenches separating the plurality of active regions and filled with an insulator material, the plurality of sharp corners of the plurality of active regions being exposed by a formation of the plurality of trenches; and
   a plurality of self-aligned charge trapping structures disposed over the plurality of active regions, the plurality of self-aligned charge trapping structures being separated from each other, each self-aligned charge trapping structure corresponding specifically to a different active region of the plurality of active regions,
   wherein the-plurality of sharp corners of the plurality of active regions are rounded by the rounding process before the plurality of trenches are filled with the insulator material and the plurality of self-aligned charge trapping structures are formed.

2. The memory device of claim 1, wherein the plurality of self-aligned charge trapping structures is aligned through a sacrificial top oxide, polish, recess, nitride etch, sacrificial top oxide etch, and top oxide process.

3. The memory device of claim 1, wherein the plurality of corners is rounded through a liner oxide process.

4. The memory device of claim 1, wherein the plurality of charge trapping structures comprises an oxide-nitride-oxide structure.

5. The device of claim 1, further comprising a tunnel oxide formed between the semiconductor substrate and a self-aligned charge trapping structure of the plurality of self-aligned charge trapping structures.

6. The memory device of claim 2, wherein the sacrificial top oxide etch comprises polishing the sacrificial top oxide by performing a chemical mechanical planarization (CMP) technique.

7. The memory device of claim 2, wherein the sacrificial top oxide etch comprises polishing the sacrificial top oxide by performing a plasma dry etch.

8. The memory device of claim 2, wherein the sacrificial top oxide etch comprises partially removing the SiRN layer.

9. The memory device of claim 4, wherein the nitride of the oxide-nitride-oxide structure is comprised of a silicon rich nitride (SiRN) layer.

10. The memory device of claim 4, wherein the nitride of the oxide-nitride-oxide structure is comprised of nitride on top of silicon rich nitride.

11. The memory device of claim 4, wherein the nitride of the oxide-nitride-oxide structure is comprised of a plurality of nitride layers having different amounts of silicon.

12. The memory device of claim 4, wherein each active region of the plurality of active regions has a corresponding SiRN layer.

* * * * *